United States Patent
Corbin et al.

(10) Patent No.: US 6,613,123 B2
(45) Date of Patent: Sep. 2, 2003

(54) VARIABLE MELTING POINT SOLDERS AND BRAZES

(76) Inventors: Stephen F. Corbin, 224 Dearborn Blvd., Waterloo, Ontario (CA), N2J 4Y3; Douglas J. McIsaac, 705-400 Parkside Dr., Waterloo, Ontario (CA), N2L 6E5; Xin Qiao, 3769 Gekeler La., Apt. 159, Boise, ID (US) 83706

( * ) Notice: Subject to any disclaimer, the term of this patent is extended or adjusted under 35 U.S.C. 154(b) by 0 days.

(21) Appl. No.: 09/863,763

(22) Filed: May 24, 2001

(65) Prior Publication Data

US 2002/0012607 A1 Jan. 31, 2002

Related U.S. Application Data

(60) Provisional application No. 60/206,786, filed on May 24, 2000.

(51) Int. Cl.⁷ .............................. B22F 1/00; B22F 3/00
(52) U.S. Cl. ........................... 75/255; 75/245; 148/24; 252/513; 252/514; 252/518.1; 252/520.1
(58) Field of Search .................. 75/255, 245; 252/513, 252/518.1, 520.1, 514; 148/24

(56) References Cited

U.S. PATENT DOCUMENTS

| | | | |
|---|---|---|---|
| 2,224,952 A | | 12/1940 | Dilley |
| 2,362,893 A | | 11/1944 | Durst |
| 3,005,258 A | | 10/1961 | Sangdahl, Jr. et al. |
| 3,141,238 A | | 7/1964 | Harman, Jr. |
| 3,442,641 A | | 5/1969 | Albers |
| 3,617,396 A | | 11/1971 | Duff et al. |
| 3,717,442 A | * | 2/1973 | Knopp |
| 3,986,899 A | | 10/1976 | Kole et al. ..................... 148/24 |
| 4,325,754 A | * | 4/1982 | Mizuhara et al. .............. 148/22 |
| 4,834,794 A | | 5/1989 | Yagi et al. |
| 4,865,654 A | * | 9/1989 | McLellan ..................... 148/24 |
| 5,229,070 A | | 7/1993 | Melton et al. |
| 5,328,521 A | | 7/1994 | Keusseyan ..................... 148/22 |
| 5,382,300 A | | 1/1995 | Blonder et al. ............... 148/24 |
| 5,540,379 A | | 7/1996 | Kazem-Goudarzi et al. |
| 5,573,602 A | | 11/1996 | Banerji et al. |
| 5,803,340 A | | 9/1998 | Yeh et al. |
| 5,928,404 A | * | 7/1999 | Paruchuri et al. .............. 75/255 |
| 5,948,320 A | * | 9/1999 | Nikaidoh et al. ........... 252/512 |
| 5,972,246 A | * | 10/1999 | Nikaidoh et al. ........... 252/512 |

FOREIGN PATENT DOCUMENTS

| | | |
|---|---|---|
| DE | 3424635 | 1/1986 |
| EP | 0867255 | 12/1997 |
| WO | 9743081 | 11/1997 |

* cited by examiner

Primary Examiner—Ngoclan Mai
(74) Attorney, Agent, or Firm—Lynn C. Schumacher

(57) ABSTRACT

Variable melting point solders and brazes having compositions comprising a metal or metal alloy powder having a low melting point with a metal powder having a higher melting point. Upon heating, in-situ alloying occurs between the low and high melting point powders such that solidification occurs at the solder or braze temperature thus creating a new, higher solidus (or melting) temperature with little or no intermetallic formation. A solder comprising Sn powder mixed with a Sn—Bi eutectic powder having a composition of 63 wt % Sn:57 wt % Bi such that the bulk composition of the mixture is 3 wt % Bi has an initial melting point of 140° C. and a re-melt temperature of 220° C. after heating due to in-situ alloying. A composition of Pb powder mixed with a Pb—Sn eutectic powder having a composition of 62 wt % Sn:58 wt % Pb such that the bulk composition of the mixture is 15 wt % Sn has an initial melting point of 183° C. and a re-melt temperature of 250° C.

59 Claims, 8 Drawing Sheets

Stage I: solid state interdiffusion

Liquid formation →

Stage II: melting and dissolution

Solid formed by surface diffusion between spreading liquid and pure Sn surface

Stage III: Liquid spreading and re-solidification

Stage IV: Secondary melting and densification

VARIABLE MELTING POINT SOLDERS AND BRAZES

CROSS REFERENCE TO RELATED U.S. APPLICATION

This application relates to U.S. Provisional patent application, Serial No. 60/206,786, filed on May 24, 2000, entitled VARIABLE MELTING POINT SOLDERS AND BRAZES.

FIELD OF THE INVENTION

This invention relates in general to solder and brazing materials and more particularly to variable melting point solders and brazes.

BACKGROUND OF THE INVENTION

Solder pastes are used to form joints between components and printed circuit boards (PCB) in the microelectronics industry. The solder provides both a physical and electrical bond. A conventional solder paste comprises a powder, made from a solder alloy, which is suspended in a liquid vehicle that contains a flux. The paste is dispensed onto a PCB, for example, by a screen-printing process. Components to be attached to the PCB are placed into the paste where they are held in place by the high viscosity of the paste. This assembly is heated such that the solder powder melts and coalesces to form a dense liquid whereupon it spreads over the component and PCB surface thus forming a metallurgical joint. Upon cooling the liquid solder solidifies and a solid joint is formed with the required mechanical, electrical and thermal properties. Common solder powders consist of alloyed metals such as lead (Pb) and tin (Sn) having compositions which give low melting points (i.e. eutectic compositions), which is advantageous from a processing point of view. A key characteristic of these solders is that they have a single reproducible melting point.

There are situations during the fabrication of microelectronics where stepwise soldering would be advantageous. In these cases, some components are soldered to a PCB, the assembly taken to another operation and then a third operation where additional components are soldered to a PCB. In yet another manufacturing method, components are soldered to one side of a PCB and other components are later soldered to the opposite side of the PCB.

In these cases the solder used in the first step must have a melting temperature higher than the solder used in the second step to avoid remelting of the solder from the first step. The use of more than one solder complicates, adds expense and can adversely affect the performance of the joints in an application.

U.S. Pat. Nos. 5,540,379, 5,573,602, and 5,803,340 are directed to a solder paste consisting of a low melting point and a high melting point metal (or alloy). When the paste is heated to the melting point of the low melting point powder the latter melts and while this phase is still liquid the paste is heated a second time to a temperature high enough to melt the rest of the mixture followed by cooling. These pastes are formulated with a composition such that most or all of the metal is liquid at the highest solder temperature.

These pastes use complex solder compositions with three or more alloying elements, contain lead (Pb) and high contents of low melting point elements such as bismuth (Bi) and indium (In). Since the solders are liquid at the soldering temperature and have a complex composition, the formation of low temperature phases which can segregate to particle or grain boundaries during freezing can be formed. These phases are detrimental to physical and mechanical properties of the resulting solder joint.

U.S. Pat. No. 5,229,070 teaches a solder produced by mixing a high tin (Sn) content alloy powder with a Sn powder substantially alloyed with either In or Bi. The Sn powder alloyed with Bi or In melts at a lower temperature than the high Sn content powder. The process consists of a single soldering step in which the paste is heated to a high enough temperature to melt all the components in the mixture. The primary purpose of this solder paste is to improve wetting and reduce the time of soldering. The solder is not designed for stepwise soldering and solidification at the soldering temperature does not occur.

U.S. Pat. No. 4,834,794 teaches a solder paste using a low and high melting point solder along with a reactive powder to form the paste. The objective of this patent is to provide a solder that has a low melting point and a higher remelting point. This is achieved by a reaction between the powders to form intermetallic compounds. A drawback to this type of solder relates to the fact that intermetallic compounds tend to be brittle and detrimental to the mechanical properties of the solder joint.

Thus the development of a solder which can melt the first time at a low temperature but not remelt at that temperature in subsequent solder operations (i.e. acquire a higher remelt temperature) would be of significant value in microelectronics where stepwise soldering is required or would be advantageous.

In the manufacture of light bulbs, solder joints are formed on an automated production line. It is advantageous to have a solder which melts at a low temperature so the cost of the soldering process can be minimized. However, when the light bulb is put into an application the melting point of the solder must be high enough that it does not re-melt during use. Therefore when using conventional solders, which have a single reproducible melting point, the soldering temperature cannot be lower than the service temperature. Thus the development of a solder which can melt the first time at a low temperature to reduce manufacturing costs but obtain a higher re-melt temperature during soldering such that it does not melt at the service temperature, would be advantageous.

In many automated furnace brazing applications it is desirous to have as low a brazing temperature as possible to minimize any detrimental microstructural changes that can occur in the base materials to be brazed. However, the service requirements again mean that the brazing temperature can not be lower than that experienced in the application. Thus the development of a braze material which can melt the first time at a low temperature to reduce damage to the base materials but obtain a higher re-melt temperature during brazing such that it does not melt at the service temperature, would be advantageous.

SUMMARY OF THE INVENTION

It is an object of the present invention to provide variable melting point solders and brazes.

The present invention provides a composition for soldering, comprising:

a powder mixture including a first constituent having a first melting point, said first constituent having a preselected first mean particle size, said first constituent including a first metal or metal alloy powder; and a second constituent including a second metal powder having a second melting point and a preselected second mean particle size, the first melting point being lower than the second melting point, said first and second mean particle sizes being selected so that upon heating to a solder temperature, such temperature being above the first melting point and below the second melting point, in-situ alloying occurs between melted first metal or metal alloy powder and the second metal powder in such a way that solidification occurs at the solder temperature with substantially no intermetallic phase formation.

The first mean particle size and said second mean particle size are selected to give a maximum rate of initial melting with minimal in-situ alloying prior to melting, and a maximum rate of in-situ alloying and solidification at the solder or brazing temperature.

The present invention also provides a composition for soldering, comprising:

a Pb—Sn eutectic powder mixed with a substantially pure Pb powder, wherein a bulk composition of Sn in the mixture is in a range from about 5 wt % to about 21 wt %, said Pb powder including particles having a first mean particle size and said Pb—Sn eutectic powder including particles having a second mean particle size, said Pb powder and Pb—Sn eutectic powder having mean particle sizes selected so that upon heating to a solder temperature, such solder temperature being above the Pb—Sn eutectic melting point and below the melting point of said substantially pure Pb powder, in-situ alloying occurs between melted Pb—Sn eutectic powder particles and Pb powder particles in such a way that solidification occurs at the solder temperature with substantially no intermetallic phase formation.

In this aspect of the invention the bulk composition of Sn in the mixture is about 15 wt % Sn and the mixture has an initial melting temperature of about 183° C. and a remelt temperature of about 250° C.

The present invention provides a composition for soldering, comprising:

a Sn—Bi eutectic powder having a composition of about 63 wt % Sn:57 wt % Bi mixed with a substantially pure tin (Sn) powder, and wherein a bulk composition of Bi in the mixture is in a range from about 2 wt % to about 19 wt %.

In this aspect of the invention the bulk composition of Bi in said mixture is about 3 wt % Bi.

The present invention provides a composition for soldering, comprising:

substantially pure Sn powder mixed with substantially pure antimony (Sb) powder, and wherein a bulk composition of Sn in the mixture includes 10 wt % Sn.

In this aspect of the invention the mixture has an initial melting temperature of about 232° C. and a remelt temperature in a range from about 240 to about 245° C. The Sn powder may have a powder size is in a range from about 200 mesh to about 325 mesh and the Sb powder has a powder size in a range from about 200 mesh to about 600 mesh.

The present invention provides a composition for soldering, comprising:

Bi powder mixed with antimony (Sb) powder, and wherein a bulk composition of antimony in the mixture is about 10 wt % Sb.

In this aspect of the invention the Bi powder may have a powder size in a range from about 200 mesh to about 325 mesh and the Sb powder has a powder size in a range from about 200 mesh to about 600 mesh, and the mixture may have an initial melting temperature of about 272° C. and a remelt temperature of about 285° C.

The present invention provides a composition for brazing, comprising:

substantially pure Ni mixed with substantially pure Cu powder such that a bulk composition of Ni in the mixture is in a range from about 15 wt % to about 85 wt % Ni.

In this aspect of the invention the bulk composition of Ni in the mixture is about 25 wt % Ni, and the Cu and Ni powder size is in a range from about 200 mesh to about 325 mesh, and the composition has an initial melting temperature of about 1085° C. and a remelt temperature of about 1175° C.

In another aspect of the invention there is provided a composition for brazing, comprising:

Cu—Ag eutectic alloy powder mixed with Cu powder such that a bulk composition of Ag in the mixture is between about 5 to about 8 wt % Ag.

In another aspect of the invention there is provided a composition for brazing, comprising:

Al—Zn eutectic alloy powder mixed with Al powder such that a bulk composition of Zn in the mixture is between about 10 to 20 wt % Zn.

In another aspect of the invention there is provided a composition for brazing, comprising:

Cu—P eutectic alloy powder mixed with Cu powder such that a bulk composition of P in the mixture is between about 1 to 2 wt % P.

In another aspect of the invention there is provided a composition for brazing, comprising:

Cu—Mn alloy powder mixed with a Ni powder such that the composition of the braze is about 80% Ni, 14% Cu and 6% Mn.

In another aspect of the invention there is provided a composition for brazing, comprising:

Cu—Sn alloy powder mixed with a Ni powder such that the composition of the braze is 80% Ni, 10% Cu, and 10% Sn.

BRIEF DESCRIPTION OF THE DRAWINGS

The present invention will now be described, by way of example only, reference being had to the accompanying drawings, in which.

DETAILED DESCRIPTION OF THE INVENTION

Figure 1:
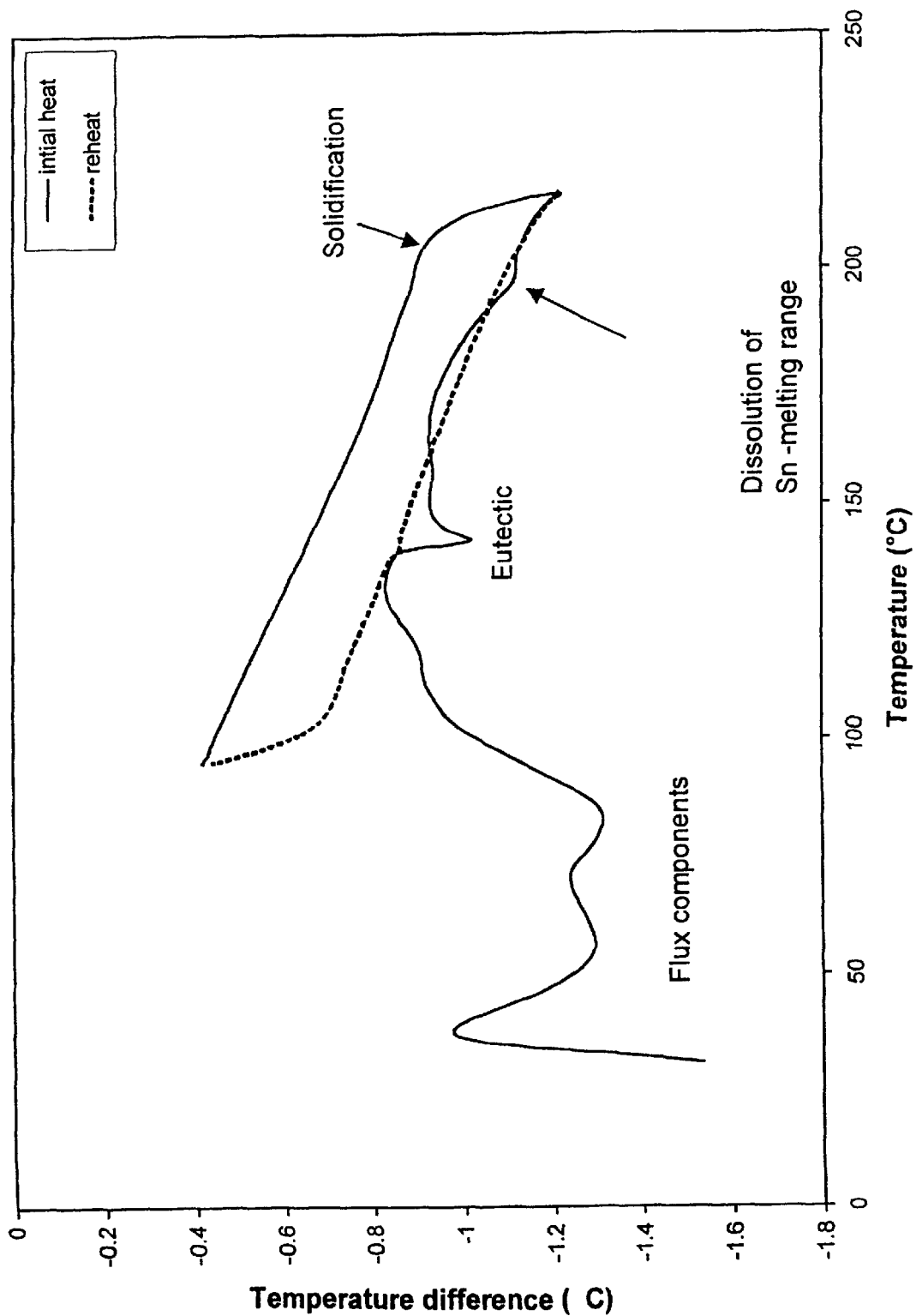
FIG. 1 is a plot of temperature difference versus temperature of an exemplary variable melting point solder produced in accordance with the present invention taken from a differential thermal analyser (DTA)

A solder or braze composition produced in accordance with the present invention is made by mixing a low melting point pure metal or alloy powder together with a higher melting point pure metal powder. As used herein, the term pure or substantially pure means a metal having a composition equal to or exceeding 98% of the metal with other elements different than the elements in the mixture not to exceed 0.5%. (i.e. in the Pb—Sn system described hereinafter, substantially pure Pb metal is 98% Pb or greater, it can have up to 2%Sn in it but may not have anymore than 0.5 wt % of any other alloying element. In most cases it would be "commercially" pure with a composition of 99.5% Pb or better.)

The low and high temperature metal or alloy powders are chosen such that they have considerable mutual solid solubility so that in-situ alloying occurs between the low and high melting point powders such that solidification occurs with no or little intermetallic formation compounds being formed between them during the in-situ alloying process. The formation of significant intermetallic compounds within the solder structure can be detrimental to the properties of the resulting solder joint. The bulk composition of the mixture is chosen such that its solidus temperature is equal to, or above, the soldering temperature, The objective of forming a solid solder or braze joint at the processing temperature requires the amount of initial liquid forming component be controlled which, in turn requires a bulk solder or braze composition with a higher amount of high melting point phase than the prior art solder compositions (generally greater than 90 wt %). It is important that the bulk composition must be chosen such that its solidus temperature is equal to or higher than the soldering process.

This mixture may be further mixed with a flux to form a paste or compacted (or tape cast) to form preform wires and/or sheets. The flux used to form the paste can be chosen from compositions commonly used in the art of making conventional solder pastes. Suitable formulations include rosin dissolved in isopropanol as well as activated rosin solutions which included 10 to 20 wt % additions of an organic acid solution such as DMA-HCL.

All powder sources have a distribution of particle sizes, where particle size is defined as the maximum diameter of an approximately spherical particle. The "mean particle size" referred to in this patent refers to a measurement of the average particle diameter of a mixture, or in the case of a mesh size range, to a minimum and maximum particle diameter of the powders.

The paste or preform is placed between two components to be joined. The assembly is heated to a maximum temperature, which is below the melting point of the higher melting point powder. During heating the low melting point powder melts and spreads throughout the paste or preform consolidating the powder mixture and joining the two components together. With further heating the liquid metal and high temperature solid metal powders undergo in-situ alloying. This alloying process transforms the liquid to a solid phase and thus the solder freezes or solidifies at the maximum temperature of the soldering process. For this to occur the soldering temperature must be equal to or less than the solidus temperature of the bulk composition of the solder powder mixture. This process occurs to the extent that no (or very little) liquid metal remains to solidify during the cool down process and a solid joint is formed at the solder temperature. The absence of a liquid phase during cool down avoids the formation of low temperature phases, which can segregate to particle or grain boundaries and be detrimental to physical and mechanical properties. Upon reheating, the solder or braze will not remelt until a temperature greater than the previous maximum temperature is reached.

During the process, enough liquid phase must initially form to consolidate the paste or preform and spread over the base materials to form the joint. However a limit is placed on the amount of liquid present in order that it may be solidified at the maximum temperature to form a solid joint. The length of time over which the liquid is present it also important. If the liquid re-solidifies too fast it may not have time to cause consolidation and joining. Conversely it may be present so long that it never solidifies at the solder or braze temperature. Controlling these features of the liquid phase requires careful selection of the powder sizes.

The powder size ranges of the different constituents are chosen such that the maximum amount of initial melting occurs, (i.e. in-situ alloying prior to melting is minimized) and that the rate at which this liquid resolidifies at the solder or braze temperature is also maximized (i.e. the rate of in-situ alloying after melting is maximized). The absolute powder sizes for a particular case will depend on the individual powder combinations chosen and the intended application.

More particularly, the absolute diameter of the particles is important as well as the relative diameters of the low and high melting point powders. The exact nature of the particle choices is dependent on the systems under consideration. For example, in systems where the low melting point liquid solidifies too slowly, both low and high melting point powder should have small diameters (e.g. 500 to 600 mesh) to promote solidification. In systems where the low melting point liquid solidifies too fast the low and high melting point powders should have large diameters (e.g. 200 to 325 mesh) to delay solidification. Intermediate rates of solidification can be achieved by choosing different particle diameters for the low and high melting point powders (i.e. large high and small low melting point powders or small high and large low melting point powders).

A major advantage of the present composition is that by using two alloying components with a larger content of high melting point phase, and the fact that solidification occurs at the soldering temperature, the formation of detrimental low melting point phases which segregate to particle or grain boundaries is reduced or avoided.

The present invention will now be illustrated by the following exemplary and non-limiting examples.

EXAMPLE 1

A solder paste having a maximum solder temperature of 220° C. was chosen. In this case a Sn—Bi alloy was used. Pure Sn powder was mixed with a Sn—Bi eutectic powder with a composition of 43 wt % Sn:57 wt % Bi such that the bulk composition of the mixture was 3 wt % Bi. This composition was chosen because its solidus temperature is about 220° C. The powders were mixed with paste chemicals common in the art. More specifically a paste containing 90 wt % of the powder mixture and 10 wt % of an activated resin solution was found to be a suitable formulation.

The paste was heated to 220° C. in a Differential Thermal Analyser (DTA), which allows the measurement of melting events. The sample was then cooled to 75° C. and then reheated to 220° C. in the same instrument to measure its re-melting characteristics. The trace from the DTA is shown in FIG. 1. As FIG. 1 indicates, the first time the paste is heated, the low melting point Sn—Bi powder melts at 140° C. This is followed by in-situ alloying between the Sn powder and the liquid, which leads to some secondary melting. The absence of a solidification peak when the sample is cooled indicates that the sample substantially froze at the solder temperature. When the sample is reheated, no melting takes place until a temperature in excess of 220° C. (more specifically 225° C.). Metallographic examination of solder pastes heated to 220° C. indicates that coalescence of the solder occurs such that a density of greater than 95% is achieved. In addition, no low melting point eutectic phases were found in the processed solders.

For this system, the Bi composition could range from about 2 to 19 wt % depending on the application. The initial melting temperature will remain fixed as the Bi content changes, however the remelt temperature will not. The remelt will range from about 225° C. at Bi=2% down to close to 140° C. at a Bi content of 19%. R=22° C. Therefore the choice of composition determines the amount of melting point shift and the peak solder or braze process temperature that can be used (the maximum process temperature should not exceed the remelt temperature of the mixture),

EXAMPLE 2

A solder paste having a maximum solder temperature of 250° C. was chosen. In this case a Pb—Sn alloy was used. Pure Pb powder was mixed with a Pb—Sn eutectic powder with a composition of 62 wt % Sn:38 wt % Pb such that the bulk composition of the mixture was 15 wt % Sn. This composition was chosen because its solidus temperature is about 250° C. The powders were mixed with paste chemicals common in the art. More specifically a paste containing 90 wt % of the powder mixture and 10 wt % of an activated rosin solution was found to be a suitable formulation.

To illustrate the influence of powder size over the re-solidification of the liquid phase, several powder size combinations were tested. In the following the term "large particles" refers to powder in the size range of 200–325 mesh and "small particles" refers to powders in the size range of 500–600 mesh. A large diameter of the high melting point powder (i.e. Pb) was mixed with either large diameter particles or small diameter particles of the Pb—Sn eutectic low melting powder, thus creating a first and second powder size combination. A small diameter of the high melting point Pb particles was mixed with either large diameter particles or small diameter particles of the Pb—Sn eutectic low melting powder, thus creating a third and fourth powder size combination. A paste of each of the four powder combinations was heated to 250° C. in a DSC. The samples were then cooled to 115° C. and then reheated to over 300° C. in the same instrument to measure its re-melting characteristics.

Figure 2:
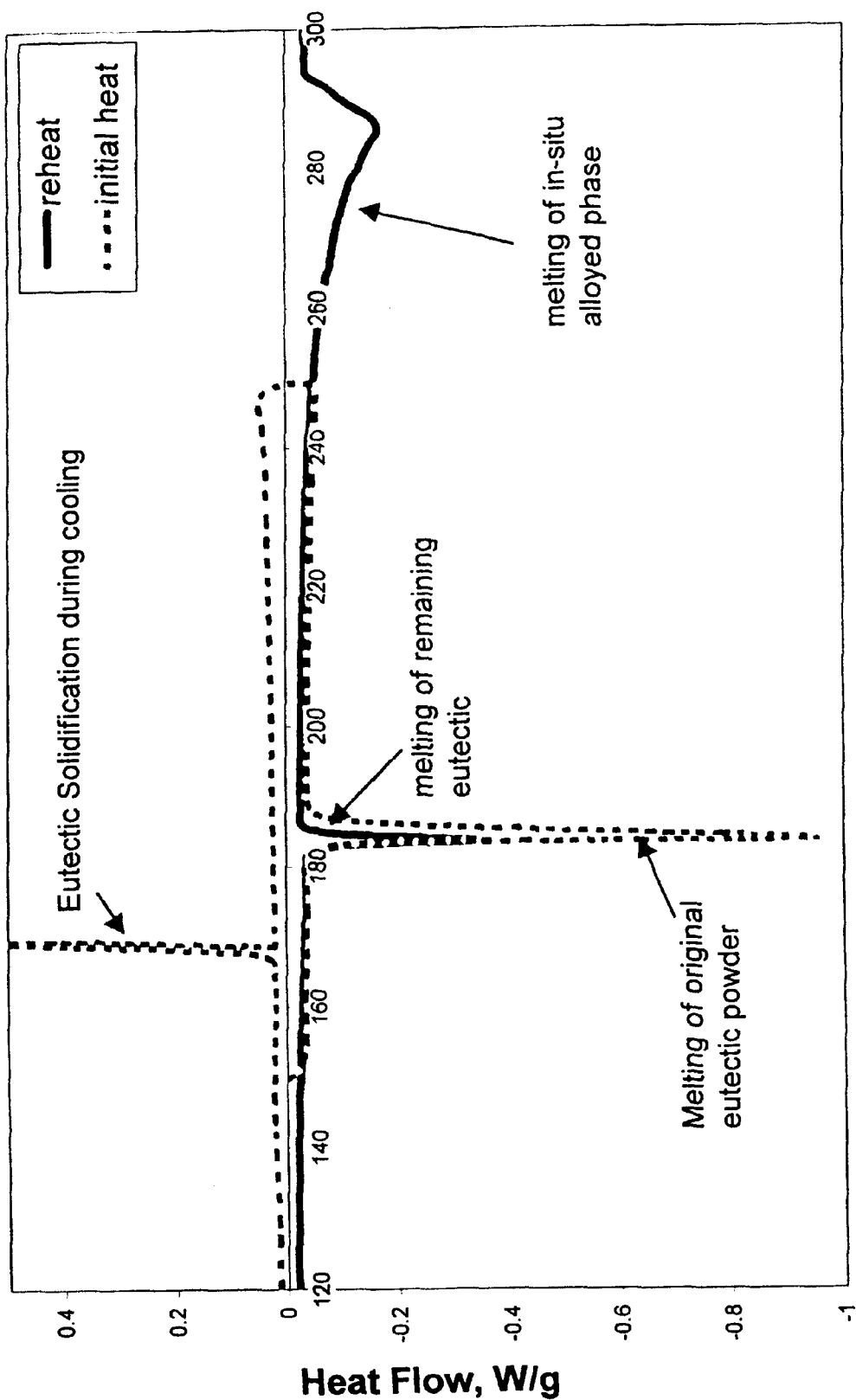
FIG. 2 shows the results of differential scanning calorimetry for a large Pb/large Pb—Sn eutectic powder combination.
Figure 3:
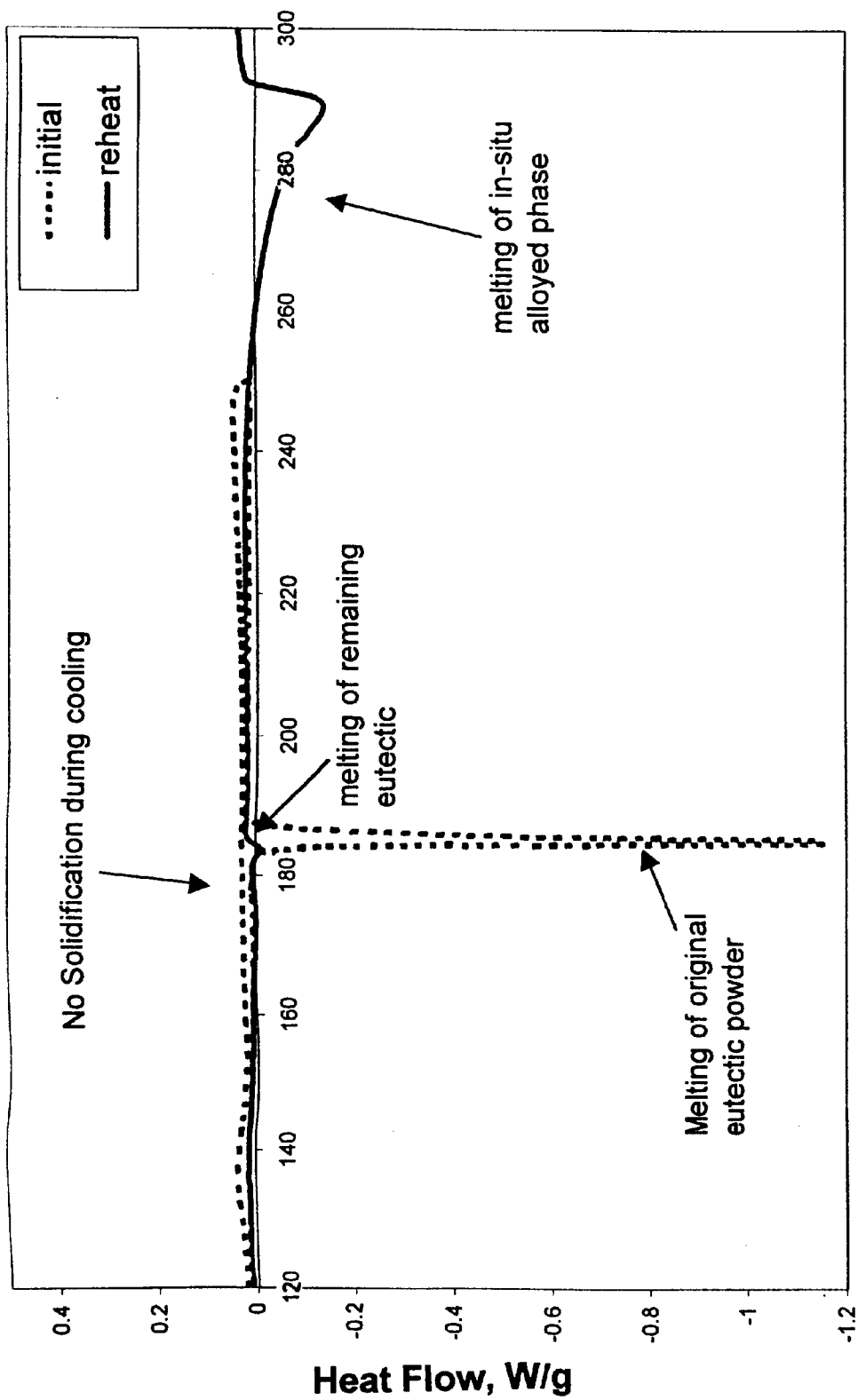
FIG. 3 shows the results of differential scanning calorimetry (DSC) for a small Pb/small Pb—Sn eutectic powder combination.

The trace from the DSC for a large Pb/large Pb—Sn eutectic powder combination and small Pb/small Pb—Sn eutectic powder combination are shown in FIGS. 2 and 3 respectively. Both solder pastes have similar initial melting characteristics. The first time the pastes are heated, the low melting point Pb—Sn powder melts at 183° C. No additional melting takes place up to the peak temperature of 250° C. While not evident in the 1$^{st}$ heating cycle, in-situ alloying does occur between the eutectic liquid and the Pb particles. In-situ alloying is indicated when the samples are cooled and then reheated. For the case of the small Pb/small Pb—Sn eutectic powder combination, no solidification of eutectic occurs during cooling and very little remelts upon reheating. This indicates the eutectic liquid did solidify at the peak temperature by in-situ alloying.

Upon reheating melting begins at a temperature of about 240° C. and continues to a temperature of 290° C. Pure Pb has a melting point of 327° C. Therefore significant in-situ alloying between the Pb and eutectic powder during initial heating is the only way in which a melting range between 240–290° C. could have occurred upon reheating. The results of FIG. 3 demonstrate that an increased melting point of over 50° C. can be achieved in this solder paste system.

The large Pb/large Pb—Sn eutectic powder combination does indicate solidification of eutectic liquid during cooling and some eutectic remelt during heating. This amount of liquid represents less than 25% of the original liquid present, so significant solidification of the liquid phase did occur at the peak temperature. The presence of a melting range between 240–290° C. upon reheating also indicates that significant in-situ alloying occurred.

However the use of this powder size combination has slowed down the solidification of the liquid during soldering compared to the small/small powder combination. Table 1 gives results for the amount of eutectic left upon re-heating for all four powder size combinations as determined by the type of DSC experiments described in FIGS. 2 and 3. Clearly the choice of powder size combination determines the rate (or amount) of low melting point phase that can be re-solidified during soldering. Large/large combinations would be chosen if the consolidation and joint formation required the liquid to be present longer. Holding the solder joint at peak temperature longer than that done in the (differential scanning calorimeter (DSC) experiments would eventually solidify the solder even in the large/large case so that its remelt characteristics would be similar to that of the fine/fine case and a melting point shift of 50° C. could be achieved. In this system the Sn content could range from 5 to 21 wt % The same reasoning in respect of the remelt temperature discussed above with respect to Example 1 applies in this example also. The remelt temperature will range from about 300° C. (5%) down to 183° C. (21%).

While this example was based on a Pb—Sn system similar results would be expected for the Sn—Bi alloy described in the first example.

EXAMPLE 3

A solder paste having a maximum solder temperature of 240° C. was chosen. In this case a Sn—Sb alloy was used. Pure Sn powder was mixed with pure Sb powder such that the bulk composition of the mixture was 10 wt % Sb. This composition was chosen because its solidus temperature is above 240° C. The powders were mixed with paste chemicals common in the art. More specifically a paste containing 90 wt % of the powder mixture and 10 wt % of an activated rosin solution was found to be a suitable formulation. The paste was heated to 240° C. in a DSC. The sample was then cooled to 200° C. and then reheated to above 290° C. in the same instrument to measure its re-melting characteristics.

Figure 4:
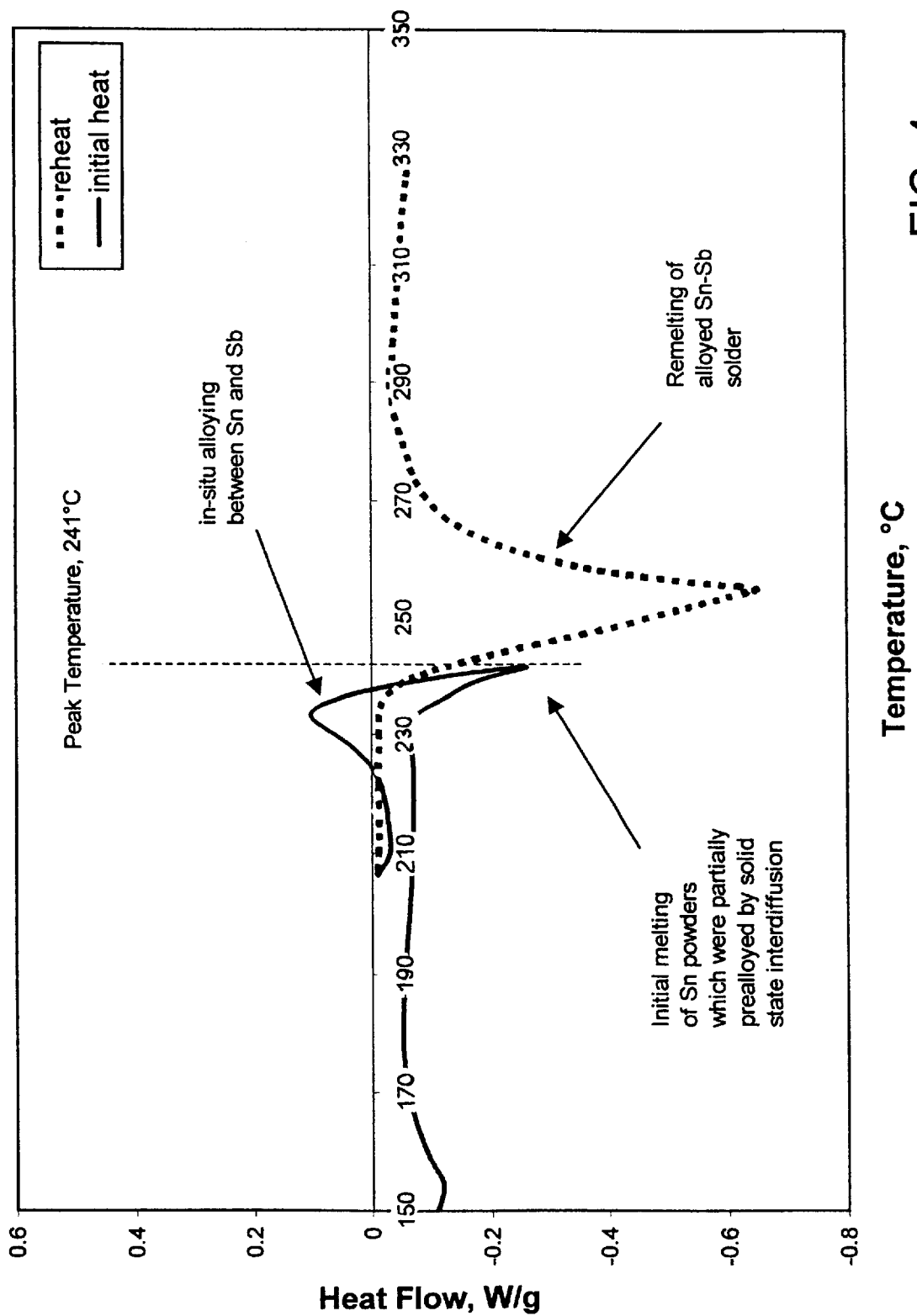
FIG. 4 shows the results of differential scanning calorimetry for a solder paste containing 90 wt % of small Sn and 10 wt % of large Sb particles.

The influence of powder size was also investigated in this system to illustrate a different powder size effect than that seen for a system like Pb—Sn described in example 2. In the first case "small Sn particles" (i.e. 500–600 mesh) were mixed with "large Sb particles" (i.e. 325 mesh). The trace from the DSC is shown in FIG. 4. The first time the paste is heated, melting begins at a temperature of 232° C. (i.e. the melting point of pure Sn). More melting takes place when heating up to 240° C. When the sample is cooled, some solidification takes place. When the sample is re-heated very little melting occurs below 240°C. indicating a successful melting point shift. However both the initial melting and solidification peaks are relatively small and much lower than that expected for the amount of Sn present in the sample (i.e. assuming all the Sn powder melted in its pure form), Extensive metallographic examination revealed that significant interdiffusion between the pure Sn and Sb particles occurs prior to melting. This reduces the amount of liquid phase produced at lower temperatures (i.e. between 232–240° C.) reducing solder consolidation and the extent of the melting point shift. In essence the in-situ alloying that is counted on to cause a melting point shift begins in the solid state which is detrimental to the over all objective of the invention.

Figure 5:
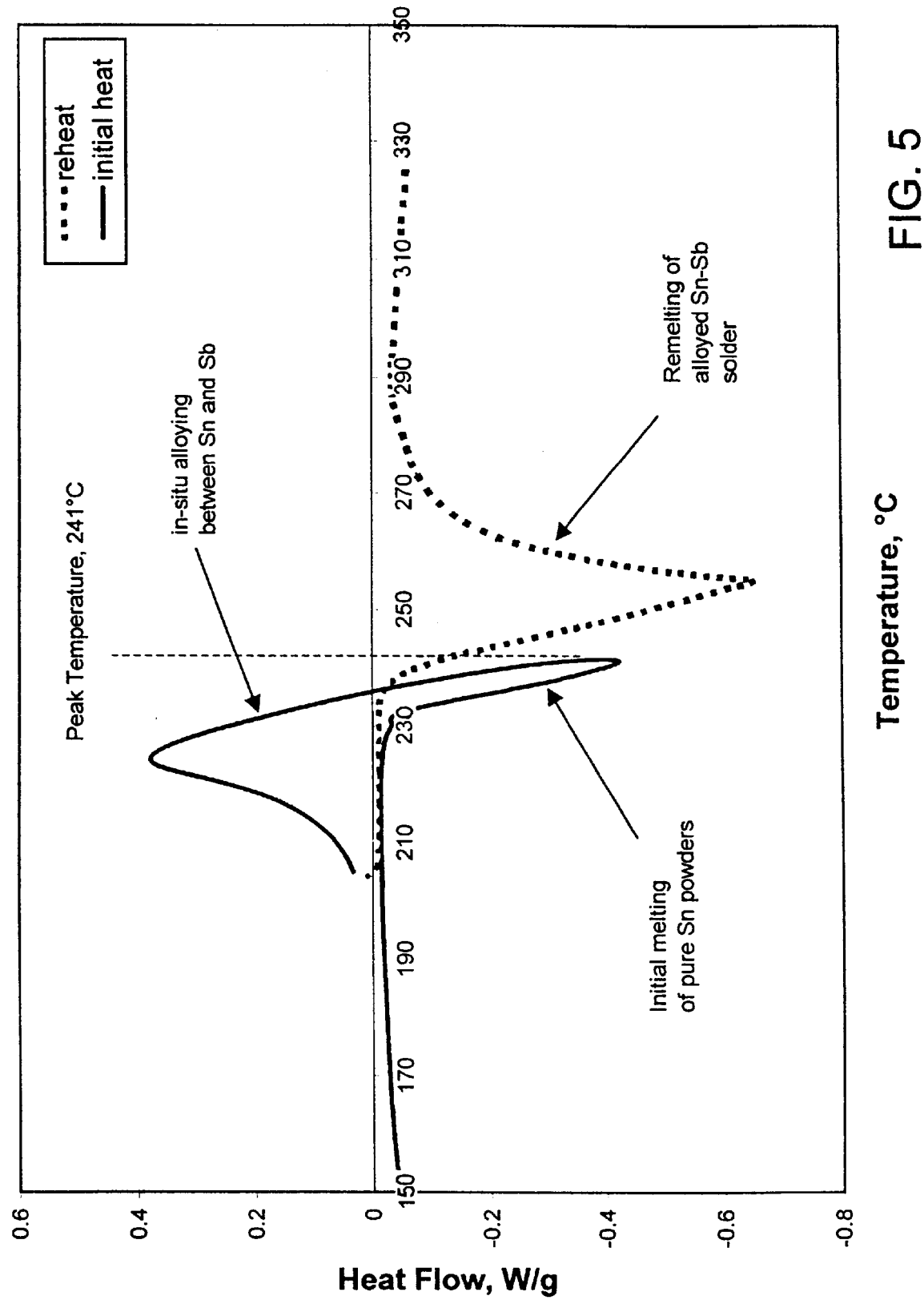
FIG. 5 shows the results of differential scanning calorimetry for a solder paste containing 90 wt % of large Sn and 10 wt % of large Sb particles.

To counteract solid state interdiffusion prior to melting large Sn particles (i.e. 100–200 mesh) were mixed with the large Sb particles of the previous case. The same heating cycle as above was used. The DSC trace from this solder paste is illustrated in FIG. 5. The original melting and solidification peaks are much larger compared to the case of small Sn particles. This indicates that the use of large Sn particles inhibits solid state interdiffusion generating more liquid phase at lower temperatures. The re-melt behavior of the large Sn-large Sb mixture is similar to that of the small Sn-large Sb mixture. Large/large powder combinations reduce the contact area between the two powder types thus reducing solid state interdiffusion.

Clearly in solder combinations where significant solid state interdiffusion can take place, large/large combinations of powders should be chosen to maximize the amount of low melting point liquid phase.

Particle size effects have a different influence over behavior in this system than seen in the Sn—Bi and Pb—Sn of examples 1 and 2. This is partly due to the fact that solid state interdiffusion is not significant in the Pb—Sn and Sn—Bi systems. However examples 2 and 3 point out two important controlling aspects of the variable melting point process. Both the amount of the initial low melting point liquid phase and its duration in the powder mixture, are important to the success of the VMP technology. The choice of particle size can strongly influence both of these processes and therefore is an important controlling parameter.

In the experiments of FIGS. 4 and 5 the solder was not held for any time at 240° C. If a holding period were included, some isothermal solidification would have occurred limiting the amount of freezing during cooling. This would lead to a re-melt temperature a few degrees higher than that shown in FIGS. 4 and 5.

EXAMPLE 4

Figure 6:
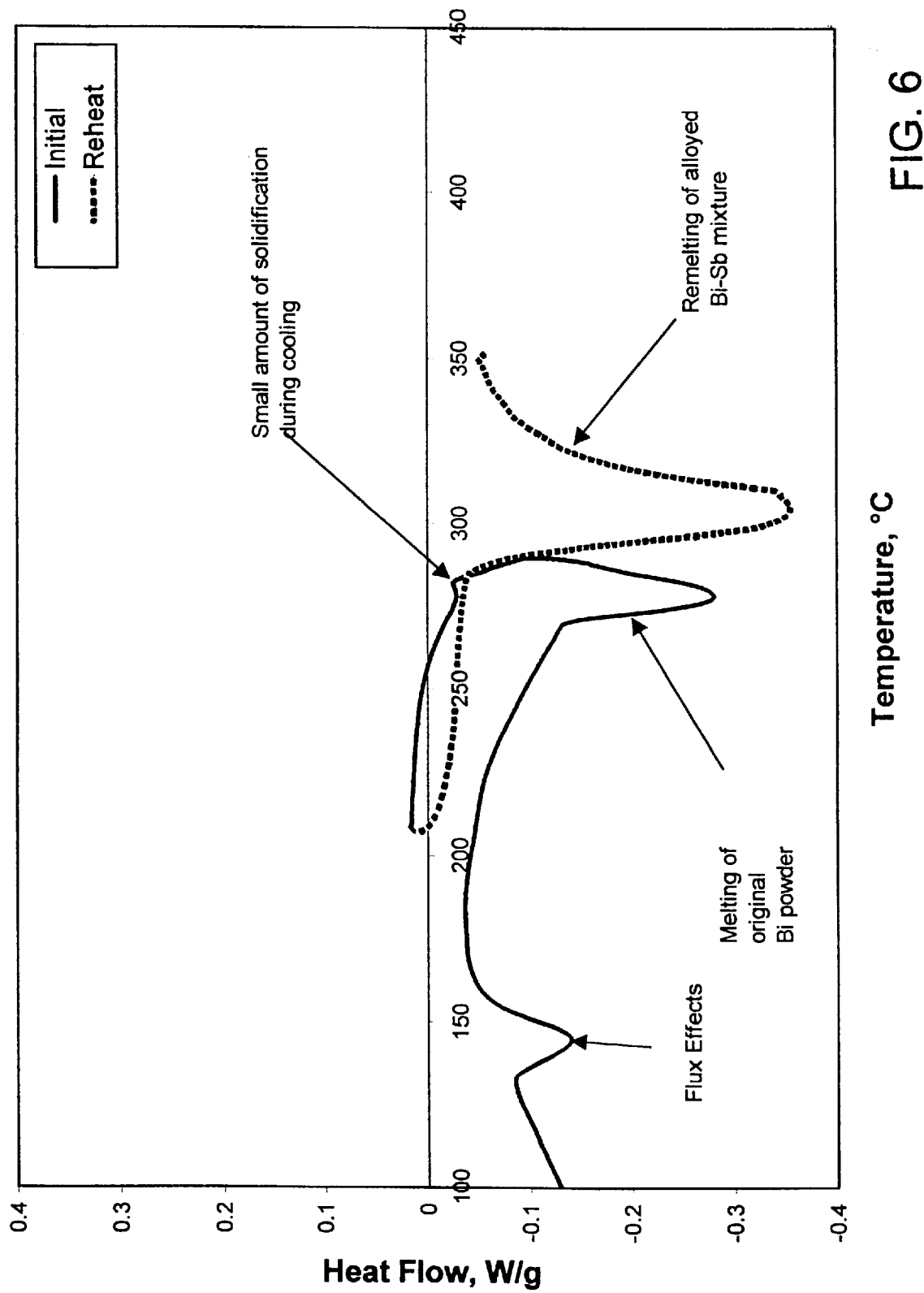
FIG. 6 shows the results of differential scanning calorimetry for a solder paste containing 90 wt % Bi and 10 wt % Sb powder.

A solder paste having a maximum solder temperature of 285° C. was chosen. In this case a Bi—Sb alloy was used. Pure Bi powder was mixed with pure Sb powder such that the bulk composition of the mixture was 10 wt % Sb. This composition was chosen because its solidus temperature is approximately 285° C. A paste containing 90 wt % of the powder mixture and 10 wt % of an activated rosin solution was found to be a suitable formulation. The paste was heated to 285° C. and held at that temperature for 5 minutes in a DSC, which allows a quantitative measurement of melting events. The sample was then cooled to 210° C. and then reheated to 350° C. in the same instrument to measure its re-melting characteristics. The trace from the DSC is shown in FIG. 6.

Melting of the powders during initial heating began at the melting point of Pure Bi (i.e. 272° C.). When the sample cools, only a small solidification peak is evident indicating that in-situ alloying has occurred between the Bi liquid and solid Sb such that the liquid solidified at the solder temperature. Upon reheating the solder does not melt until the original peak temperature is exceeded. The compositions exemplified in Example 4 are isomorphous and the compositional range could be very large depending on the application. Efficacious solder compositions may be formulated having between 10 to 80 wt % Bi in the Sn—Bi system,

EXAMPLE 5

A brazing compound having a maximum brazing temperature of 1110° C. was chosen. In this case a Cu—Ni alloy was used. Pure Ni powder was mixed with pure Cu powder such that the bulk composition of the mixture was 25 wt % Ni. This composition was chosen because its solidus temperature (i.e. 1175° C.), is above the brazing temperature of 1110° C. The brazing compound was heated in a nitrogen atmosphere at a rate of 20° C. per minute to 1110° C. in a DSC, which allows a quantitative measurement of melting events. The sample was then cooled to 925° C. and then reheated to 1110° C. In the same instrument to measure its re-melting characteristics.

The influence of powder size was also investigated in this system, in all cases the Cu powder size was fixed at a mesh size of 325. However this Cu powder was mixed with one of three different Ni powder sizes. These sizes included "large Ni particles" (i.e. 48–150 mesh), medium Ni particles (i.e. –100+325 mesh) and small Ni particles (3–7 microns). An example of the melting/remelting behavior of these brazes is shown in FIG. 7 for the case of Cu-25 wt % Ni made using the medium Ni particles.

Melting of the Cu powder during initial heating began at the melting point of pure Cu (i.e. about 1085° C.) and the DSC trace indicates a large melting peak between 1085 and 1110° C. When the sample was cooled, a large solidification peak is also evident. However, upon reheating, the braze clearly indicates a higher melting point onset of about 1100° C. and very little total melting up to the peak temperature of 1110° C. Cooling of the braze for the second time also indicates very little re-solidificatlon. These features on the DSC curve indicate that significant in-situ alloying has occurred in the powders resulting in an increased melting point.

Figure 7:
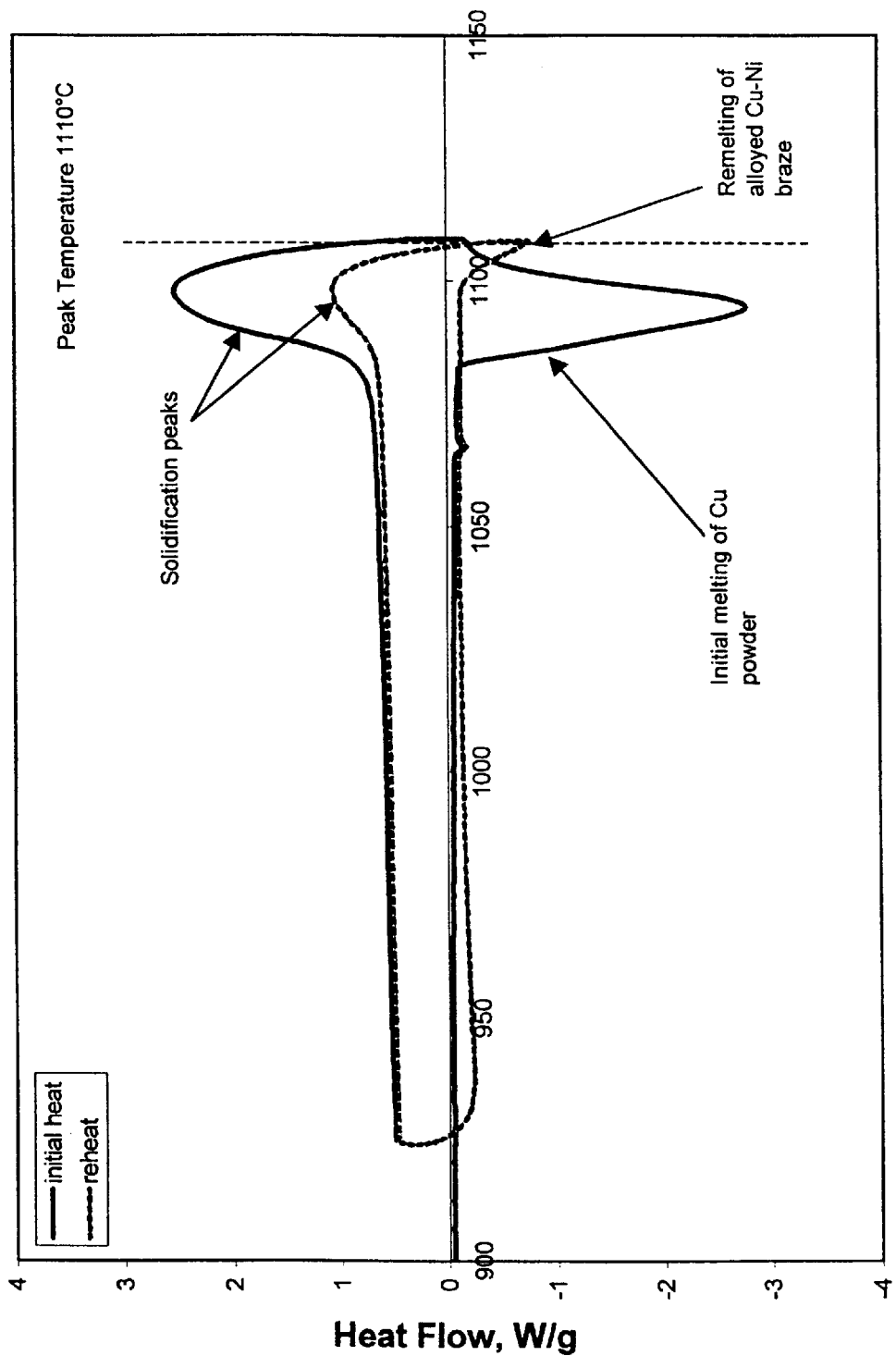
FIG. 7 shows is a DSC trace showing the melting/remelting behavior of a braze of Cu-25 wt % Ni made using the medium Ni particles.

Several quantitative measurements can be made from a DSC trace such as that of FIG. 7. The enthalpy of melting (in Joules/gram (J/g)) of the initial Cu liquid can be measured as well as the enthalpy of the re-melt peak upon reheating the braze. The magnitude of these values directly indicate the amount of liquid formed in the braze compound. These measurements were obtained from a series of experiments designed to illustrate the influence of Ni particle size, hold time near the braze temperature and heating rate on the melt/remelt behavior of a Cu—Ni variable melting point braze compound. Tables 2 and 3 summarize the results of this work.

In Table 2 the influence of heating rate and Ni powder size on the initial melt and re-melt peaks are illustrated. At a given heating rate, the amount of liquid, which forms upon the first heat cycle, is strongly influenced by the Ni powder size. As the Ni powder size is reduced, initial liquid formation is reduced. This occurs to such an extent that, when a small Ni powder size is used, no initial melting is detected up to the braze temperature of 1110° C. (except at a heat rate of 40° C./min, where a very small amount of melting is detected). Metallographic analysis has confirmed that this is due to extensive solid-state interdiffusion which occurs between the pure Cu and Ni powders. This interdiffusion prealloys the pure Cu powder to the extent that its melting point shifts above 1110° C. Table 2 indicates that, as the sample is heated faster, less time is given for prealloying, resulting in more initial melting. This is most evident in the mixtures where large and medium Ni powder was used in the braze compound. With the use of large Ni powder and a heating rate of 40° C./min, liquid formation during initial heating is near 100%. This indicates that prealloying prior to melting can be avoided by the use of large Ni powders and high heating rates.

Table 2 also indicates the degree to which the melting point shifts by measuring the enthalpy of remelting when the sample is reheated to the braze temperature of 1110° C. As the Ni particle size is reduced from large to medium the extent of the melting point shift increases. (A melting point shift has little meaning for the Fine Ni samples where no initial melting took place). Metallographic analysis indicates that good consolidation was achieved in both the Cu-25 wt % large Ni and Cu-25 wt % medium Ni braze samples. Therefore, since a better melting point shift was achieved with medium Ni particles, these would be the best candidate for a variable melting point Cu—Ni braze.

The compositions exemplified in Example 5 are isomorphous and the compositional range could be very large depending on the application. Efficacious brazing compositions may be formulated having between about 20 to 80 wt % Ni in the Cu—Ni system.

Figure 8:
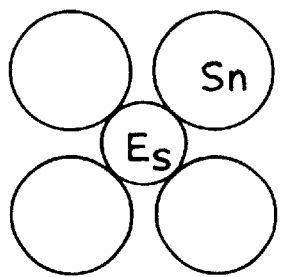
FIG. 8 is a diagrammatic representation of the different stages of melting of a variable melting point solder paste produced in accordance with the present invention.
Figure 8:
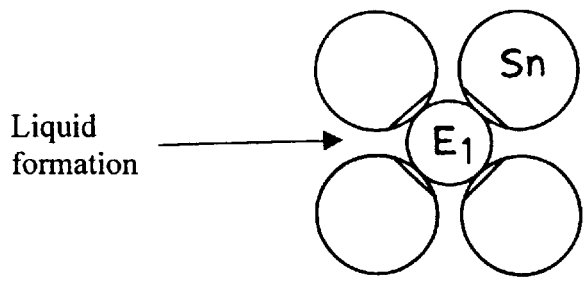
Figure 8:
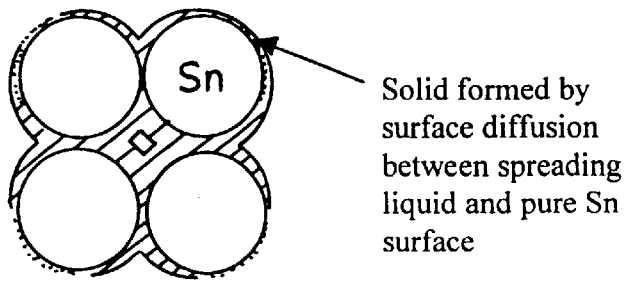
Figure 8:
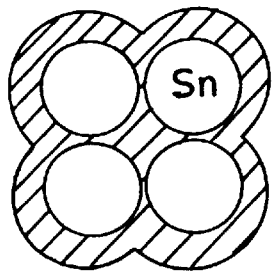

The behavior of the variable melting point solders and brazes and the influence of particle size can be understood and described using the schematic model presented in FIG. 8. The example in the figure is based on the Sn—Bi solder of the first Example I but the principles described apply equally well to Examples 2, 3, 4 and 5.

Depicted in FIG. 8 is an arrangement of pure Sn and eutectic Sn—Bi powders as they would exist in side the solder paste. In areas where the Sn and eutectic particles are in direct contact, solid-state interdiffusion can occur as the solder is heated (i.e. stage I). In this alloy system interdiffusion primarily results in the absorption of Bi into the pure Sn particles to form a Sn rich solid solution near the surface of the particle. This could actually result in a small reduction in the amount of eutectic in the material prior to melting. (The Sn—Sb system of example 3 and the Cu—Ni of example 5 clearly illustrate cases where interdiffusion in stage I can significantly influence the process). When the eutectic temperature is reached, the eutectic particles melt and begin to spread throughout the powder compact by capillary forces (i.e. stage II). As the liquid spreads it comes in contact with a large surface area of pure Sn solid. In order to maintain equilibrium, surface diffusion of Bi into the Sn occurs rapidly, resulting in in-situ alloying and re-solidification of the liquid begins (Stage III). During stage II consolidation of the solder and joining to the base components must occur. Therefore the transition from stage II to stage III is a critical step. Since in-situ alloying and re-solidification primarily occurs by surface diffusion it is very sensitive to the surface area of the pure Sn (or higher melting point) powder. A high surface area is present when the solder paste is made with small diameter Sn particles and therefore re-solidification is rapid. The opposite occurs when the paste is made with large Sn particles. The size of the low melting point particles also effects stage III. If the eutectic particles are small the low melting point phase is inherently uniformly distributed throughout the powder compact. When this phase melts it does not need to spread as far to come in contact with solid Sn surface. Therefore re-solidification can occur more quickly. When the eutectic particles are large the low melting point phase is inherently poorly distributed. Therefore when the particles melt the liquid must flow over longer distances to come in contact with solid Sn surface. Consequently in-situ alloying and resolidification occurs more slowly. On this basis combinations where both particles are large should lead to the slowest resolidification whereas combinations where both particles are small should lead to the fastest solidifications. The example 2 clearly demonstrates that this is the case.

In solder or braze formulations where a limited amount of low melting point powder is present such as in the Sn—Bi and Pb—Sn solders of Example 1 and 2, slow re-solidification and the use of large powder combinations will likely achieve the best results. In formulations where high amounts of low melting powders are present, such as Sn—Sb, Cu—Ni and Bi—Sb, more rapid solidification may be required and the use of small particle combinations desired. This is evident in the Cu—Ni system where medium Ni particles are better than large Ni particles. However in systems like this where extensive solid-state interdiffusion is also present, the use of very small powders may reduce initial liquid formation (e.g. Cu-25 wt % small Ni). In solders or brazes of this type, where a large amount of initial liquid is present but solid state interdiffusion is large, an optimum mixture between large and small particles will give the best results (e.g. Cu-25 wt % medium Ni of example 5).

In solders such as the Sn—Bi alloys stage III is followed by Stage IV where some of the re-solidified liquid re-melts as the temperature increases. This leads to secondary melting and further in-situ alloying followed by re-solidification. In solders like the Pb—Sn paste stage IV does not occur because the in-situ alloying produces compositions whose melting point is higher than the solder temperature (i.e. 250° C. in FIGS. 3 and 4).

Examples 1–5 were chosen because they represent different binary alloy systems, all of which are suitable for the development of variable melting point solders or brazes. The Bi—Sb and Cu—Ni system, with isomorphous phases diagram, exhibit unlimited solid and liquid solubility. In systems like these the pure metal with the lowest melting point is chosen as the low melting point powder addition (e.g. Bi or Cu) and the pure metal with the highest melting point chosen as the high melting point powder addition (e.g. Sb or Ni). These systems can generally contain large amounts of initial low melting point phase such as the Bi-10 wt % Sb paste of Example 4 or the Cu-25 wt % Ni braze of example 5.

The Pb—Sn and Sn—Bi systems have binary eutectic phase diagrams and therefore limited solid solubility and the formation of a low melting point eutectic phase when the solubility limit is reached. In these systems the low melting point powder is chosen to be at the eutectic composition and the high melting point powder chosen from either of the two higher melting point pure powders. In systems like these the amount of liquid phase is lower than in isomorphous systems because the bulk composition of the mixture must be within the solubility limit of the phases.

The Sn—Sb system has a more complex phase diagram that has limited solubility and the formation of several intermediate or intermetallic compounds. However in the Sn rich region of the phase diagram there is some solid solubility of Sb in Sn. Therefore mixtures of Sn with Sb up to 10 wt % can be used to form variable melting point solders without forming significant amounts of intermetallic phase.

The above examples and explanations lay out the methods for developing and optimizing variable melting point solders and brazes. Table 3 lists some suggested additional braze compositions and their initial and re-melt temperatures. The first 3 examples are binary eutectic systems similar to Pb—Sn and Sn—Bi. Therefore in the Cu—Ag case the mixture would consist of a 1st powder with a eutectic alloy bulk composition of 28% Cu:72% Ag and a $2^{nd}$ powder of substantially pure Cu composition, where both powders are mixed in a ratio such as to obtain a bulk composition of 5 to 8 wt % Ag. The Al—Zn braze would consist of a 1st powder with a eutectic alloy bulk composition of 94% Zn:6% Al and a $2^{nd}$ powder of substantially pure Al composition, where both powders are mixed in a ratio such as to obtain a bulk composition of 10 to 20 wt % Zn. The Cu—P braze would consist of a 1st powder with a eutectic alloy bulk composition of 8.3% P:91.7% Cu and a $2^{nd}$ powder of substantially pure Cu composition, where both powders are mixed in a ratio such as to obtain a bulk composition of 1 to 2 wt % P.

The 4th example is a ternary isomorphous phase diagrams system similar to Bi—Sb or Cu—Ni. It would consist a 1st powder with a alloy bulk composition of 70% Cu:30% Mn and a $2^{nd}$ powder of substantially pure Ni composition, where both powders are mixed in a ratio such as to obtain a bulk composition illustrated in Table 3. The $5^{th}$ example is a ternary alloy phase diagram system similar to Sn—Sb. It would consist a 1st powder with a alloy bulk composition of 50% Cu:50% Sn and a $2^{nd}$ powder of substantially pure Ni composition, where both powders are mixed in a ratio such as to obtain a bulk composition illustrated in Table 3. The primary difference between the systems of Table 3 and the systems of examples 1–5 is that their compositions and melting temperatures differ. Many of the principles of variable melting point behavior described in this invention will also apply to the brazes of Table 3.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

TABLE 1

Re-melt characteristics of Pb-15% Sn variable melting point solders with different powder size combinations.

| Powder combination | % re-solidified |
|---|---|
| Small E/small Pb | 98% |
| large E/small Pb | 90% |
| Small E/large Pb | 80% |
| Large E/large Pb | 77% |

TABLE 2

Quantitative measurements of enthalpy of melting and remelting, made from DSC curves, as a function of heating rate and Ni powder size.

| Sample | 10 (° C./min) | | 20 (° C./min) | | 40 (° C./min) | |
|---|---|---|---|---|---|---|
| Heating rate | Melt peak* | Re-melt peak** | Melt peak* | Re-melt peak** | Melt peak* | Re-melt peak** |
| Cu-25 wt % large Ni | 86 | 12 | 92 | 11 | 99 | 11 |
| Cu-25 wt % medium Ni | 69 | 3.1 | 70 | 3.6 | 78 | 4.3 |
| Cu-25 wt % small Ni | 0 | 0 | 0 | 0 | 1.6 | 0 |

*This value of the enthalpy of melting is expressed as a percentage of that expected if all of the Cu in the mixture melted in its pure form.
**This value of enthalpy of remelting is expressed as a percentage of the enthalpy measured from the original melting peak.

TABLE 3

Brazing compositions with low and high temperature variable melting point brazing compositions

| Alloy system | Composition | Initial melt Temperature (° C.) | Re-melt temperature (° C.) |
|---|---|---|---|
| Cu—Ag | 5 to 8% Ag | 780 | 950 |
| Al—Zn | 10 to 20% Zn | 380 | 500–600 |
| Cu—P | 1 to 2% P | 714 | 900–950 |
| Ni—Cu—Mn | 20% Cu&Mn, bal. Ni | 871 | >1200 |
| Ni—Cu—Sn | 20% Cu&Sn, bal. Ni | 600 | >1100 |

Therefore what is claimed is:

1. A composition for soldering, comprising:
   a powder mixture including a first constituent having a first melting point, said first constituent having a preselected first mean particle size, said first constituent including a first metal or metal alloy powder; and
   a second constituent including a second metal powder having a second melting point and a preselected second mean particle size, the first melting point being lower than the second melting point, said first and second mean particle sizes being selected so that upon heating to a solder temperature, such temperature being above the first melting point and below the second melting point, in-situ alloying occurs between melted first metal or metal alloy powder and the second metal powder in such a way that solidification occurs at the solder temperature with substantially no intermetallic phase formation.

2. The composition according to claim 1 wherein said first mean particle size and said second mean particle size are selected to give a maximum rate of initial melting with minimal in-situ alloying prior to melting, and a maximum rate of in-situ alloying after melting, resulting in solidification at the solder temperature.

3. The composition according to claim 1 wherein said first mean particle size and said second mean particle size are selected to give a desired solidification rate of a low melting point liquid produced by melting of the first constituent.

4. The composition according to claim 3 wherein said first mean particle size and said second mean particle size are in a range from about 500 to 600 mesh to promote rapid solidification of said low melting point liquid.

5. The composition according to claim 3 wherein said first mean particle size and said second mean particle size are in a range from about 200 to about 325 mesh to delay solidification of said low melting point liquid.

6. The composition according to claim 3 wherein said first mean particle size is in a first range and said second mean particle size is in a second range to give intermediate rates of solidification of said low melting point liquid.

7. The composition according to claim 1 wherein said mixture is compacted into wires or sheets.

8. The composition according to claim 1 wherein said mixture is tape cast into preselected shapes.

9. The composition according to claim 1 wherein said mixture is mixed with a flux to form a paste.

10. The composition according to claim 1 wherein said first mean particle size and said second mean particle size are in a range from about 100 mesh to about 600 mesh.

11. A composition for soldering, comprising:
a Pb—Sn eutectic powder mixed with a substantially pure Pb powder, wherein a bulk composition of Sn in the mixture is in a range from about 5 wt % to about 21 wt %, said Pb powder including particles having a first mean particle size and said Pb—Sn eutectic powder including particles having a second mean particle size, said Pb powder and Pb—Sn eutectic powder having mean particle sizes selected so that upon heating to a solder temperature, such solder temperature being above the Pb—Sn eutectic melting point and below the melting point of said substantially pure Pb powder, in-situ alloying occurs between melted Pb—Sn eutectic powder particles and Pb powder particles in such a way that solidification occurs at the solder temperature with substantially no intermetallic phase formation.

12. The composition according to claim 11 wherein said bulk composition of Sn in the mixture is about 15 wt % Sn.

13. The composition according to claim 12 wherein said mixture has an initial melting temperature of about 183° C. and a remelt temperature of about 250° C.

14. The composition according to claim 11 wherein said mixture is mixed with a flux to form a paste.

15. The composition according to claim 14 wherein said paste comprises about 90 wt % of the powder mixture and about 10 wt % of said flux.

16. The composition according to claim 15 wherein said flux is an activated rosin solution.

17. The composition according to claim 12 wherein both the Pb powder and eutectic Pb—Sn powder have powder sizes in a range from about 200 mesh to about 325 mesh.

18. The composition according to claim 11 wherein both the Pb powder and eutectic Pb—Sn powder have powder sizes in a range from about 500 mesh to about 600 mesh.

19. A composition for brazing, comprising:
a powder mixture including a first constituent having a first melting point, said first constituent having a preselected first mean particle size, said first constituent including a first metal or metal alloy powder; and
a second constituent including a second metal powder having a second melting point and a preselected second mean particle size, the first melting point being lower than the second melting point, said first and second mean particle sizes being selected so that upon heating to a braze temperature, such temperature being above the first melting point and below the second melting point, in-situ alloying occurs between melted first metal or metal alloy powder and said second metal powder in such a way that solidification occurs at the braze temperature with substantially no intermetallic phase formation.

20. The composition according to claim 19 wherein said first mean particle size and said second mean particle size are selected to give a maximum rate of initial melting with minimal in-situ alloying prior to melting, and a maximum rate of in-situ alloying after melting, resulting in solidification at the braze temperature.

21. The composition according to claim 19 wherein said first mean particle size and said second mean particle size are selected to give a desired solidification rate of a low melting point liquid produced by melting of the first constituent.

22. The composition according to claim 21 wherein said first mean particle size and said second mean particle size are in a range from about 500 to 600 mesh to promote rapid solidification of said low melting point liquid.

23. The composition according to claim 21 wherein said first mean particle size and said second mean particle size are in a range from about 200 to about 325 mesh to delay solidification of said low melting point liquid.

24. The composition according to claim 21 wherein said first mean particle size is in a first range and said second mean particle size is in a second range to give intermediate rates of solidification of said low melting point liquid.

25. The composition according to claim 19 wherein said powder mixture is compacted into wires or sheets.

26. The composition according to claim 19 wherein said powder mixture is tape cast into preselected shapes.

27. The composition according to claim 19 wherein said powder mixture is mixed with a flux to form a paste.

28. A composition for soldering according to claim 1 wherein the first constituent is substantially pure tin powder and the second constituent is Sn—Bi eutectic powder having a composition of about 43 wt % Sn:57 wt % Bi and wherein a bulk composition of Bi in the mixture is in a range from about 2 wt % to about 19 wt %.

29. The composition according to claim 28 wherein said bulk composition of Bi in said mixture is about 3 wt % Bi.

30. The composition according to claim 29 wherein said mixture has an initial melting temperature of about 140° C. and a remelt temperature of about 220° C.

31. The composition according to claim 29 wherein said mixture is mixed with a flux to form a paste.

32. The composition according to claim 31 wherein said paste comprises about 90 wt % of the mixture and about 10 wt % of said flux.

33. The composition according to claim 32 wherein said flux is an activated rosin solution.

34. The composition according to claim 28 wherein both the Sn powder and Sn—Bi eutectic powder have powder sizes in a range from about 200 mesh to about 325 mesh.

35. The composition according to claim 28 wherein both the Sn powder and Sn—Bi eutectic powder have powder sizes in a range from about 500 mesh to about 600 mesh.

36. A composition for soldering according to claim 1 wherein the first constituent is substantially pure Sn powder and the second constituent is substantially pure antimony (Sb) powder, and wherein a bulk composition of Sn in the mixture includes 10 wt % Sn.

37. The composition according to claim 36 wherein said mixture has an initial melting temperature of about 232° C. and a remelt temperature in a range from about 240 to about 245° C.

38. The composition according to claim 36 wherein said mixture is mixed with a flux to form a paste.

39. The composition according to claim 38 wherein said paste comprises about 90 wt % of the mixture and about 10 wt % of said flux.

40. The composition according to claim 39 wherein said flux is an activated rosin solution.

41. The composition according to claim 36 wherein the Sn powder has a powder size is in a range from about 200 mesh to about 325 mesh and the Sb powder has a powder size in a range from about 200 mesh to about 600 mesh.

42. The composition according to claim 41 wherein the Sb powder size is in a range from about 500 mesh to about 600 mesh.

43. A composition for soldering according to claim 1 wherein the first constituent is substantially pure Bi powder and the second constituent is substantially pure antimony (Sb) powder, and wherein a bulk composition of antimony in the mixture is about 10 wt % Sb.

44. The composition according to claim 43 wherein said mixture has an initial melting temperature of about 272° C. and a remelt temperature of about 285° C.

45. The composition according to claim 43 wherein said mixture is mixed with a flux to form a paste.

46. The composition according to claim 45 wherein said paste comprises about 90 wt % of the mixture and about 10 wt % of said flux.

47. The composition according to claim 46 wherein said flux is an activated rosin solution.

48. The composition according to claim 43 wherein the Bi powder has a powder size in a range from about 200 mesh to about 325 mesh and the Sb powder has a powder size in a range from about 200 mesh to about 600 mesh.

49. The composition according to claim 48 wherein the Sb powder size is in a range from about 500 mesh to about 600 mesh.

50. A composition for brazing according to claim 19 wherein the second constituent is substantially pure Ni and the first constituent is substantially pure Cu powder such that a bulk composition of Ni in the mixture is in a range from about 15 wt % to about 85 wt % Ni.

51. The composition according to claim 50 wherein said bulk composition of Ni in the mixture is about 25 wt % Ni.

52. The composition according to claim 50 wherein the Cu and Ni powder size is in a range from about 200 mesh to about 325 mesh.

53. The composition according to claim 50 wherein the Cu powder size is in a range from about 200 mesh to about 325 mesh, and wherein the Ni powder size is in a range from about 48 mesh to about 200 mesh.

54. The composition according to claim 51 wherein said composition has an initial melting temperature of about 1085° C. and a remelt temperature of about 1175° C.

55. A composition for brazing according to claim 19 wherein the first constituent is Cu—Ag eutectic alloy powder and the second constituent is substantially pure Cu powder such that a bulk composition of Ag in the mixture is between about 5 to about 8 wt % Ag.

56. A composition for brazing according to claim 19 wherein the first constituent is Al—Zn eutectic alloy powder and the second constituent is substantially pure Al powder such that a bulk composition of Zn in the mixture is between about 10 to 20 wt % Zn.

57. A composition for brazing according to claim 19 wherein the first constituent is Cu—P eutectic alloy powder and the second constituent is substantially pure Cu powder such that a bulk composition of P in the mixture is between about 1 to 2 wt % P.

58. A composition for brazing according to claim 19 wherein the first constituent is Cu—Mn alloy powder and the second constituent is substantially pure Ni powder such that the composition of the braze is about 80% Ni, 14% Cu and 6% Mn.

59. A composition for brazing according to claim 19 wherein the first constituent is Cu—Sn alloy powder and the second constituent is substantially pure Ni powder such that the composition of the braze is 80% Ni, 10% Cu, and 10% Sn.

* * * * *